SEMICONDUCTOR POWER DEVICE

Filed Feb. 3, 1964

INVENTORS.
ALAN J. CARLAN
KENNETH H. WALLHAUSEN
RAY H. SALINAS
WILLARD E. PAYNE
BARNEY P. BAZIN, Jr.
BY
ATTORNEY 3,265,805

SEMICONDUCTOR POWER DEVICE

Alan J. Carlan, Kenneth H. Wallhausen, and Ray H. Salinas, Monroeville, Willard E. Payne, Connellsville, and Barney P. Bazin, Jr., United, Pa., assignors to Power Components, Inc., Scottdale, Pa., a corporation of Pennsylvania Filed Feb. 3, 1964, Ser. No. 341,908
4 Claims. (Cl. 174—52)

This invention relates to semiconductor rectifiers and the like, and more particularly to semiconductor power rectifiers subjected to varying thermal stresses at elevated temperatures.

As is known, the current-carrying capacity of semiconductor power rectifier assemblies manufactured in accordance with the usual prior art practices has been small as compared to the maximum current-carrying capacity of the rectifier element itself. This was due, among other things, to an inability to adequately and uniformly dissipate the heat which is generated at the semiconductor junction during the rectification process while at the same time providing for differential thermal expansion and contraction of the various parts of the assembly. The usual rectifier of this type comprises a semiconductor element of silicon or germanium connected at opposite sides of a single P–N or multiple P–N junctions to electrical contacts or terminals, and surrounded by a hermetically-sealed enclosure. Since the semiconductor element and ceramic materials often used for the housing forming the sealed enclosure have coefficients of thermal expansion greatly different from that of the power terminals required for good electrical and thermal conduction, thermal stresses due to differences in rates of expansion may cause damage or destruction of the rectifier assembly composed of these different substances.

Various ways and means have been proposed to cope with the problem of differential thermal expansion in power rectifier assemblies. Probably the most common of these is to connect one side of the semiconductor element to the top power terminal through an internal flexible, braided or flexible disc contact, while the other side is bonded directly to the bottom power terminal. Although this arrangement insures a certain amount of flexibility for facilitating differential thermal expansion of the various parts of the device, it also has serious limitations. First, almost all of the heat generated by the semiconductor element is transferred primarily through the bottom of the element to the bottom terminal which is formed of high conductivity metal of relatively large mass. Thus, the top of the element can get significantly hotter than the bottom, causing premature failure of the device or necessitating a reduced power rating below the inherent rating of the semiconductor element itself. Secondly, the current and heat carrying capacity of a braided element is never as good as that of a solid element of the same cross-sectional area at frequencies normally encountered with power rectifiers, meaning that this part of the assembly may heat up in high current operation due to excessive thermal and electrical resistance.

As an overall object, the present invention seeks to provide a power rectifier assembly which overcomes the aforementioned and other limitations of prior art devices of this type.

More specifically, an object of the invention is to provide a power rectifier assembly wherein the internal flexible, braided or flexible disc contact is eliminated and replaced by a solid contact element, thereby greatly enhancing the rate of heat dissipation from the semiconductive element and eliminating the problems encountered when one side of the semiconductive element becomes hotter than the other.

Still another specific object of the invention is to provide a semiconductive power rectifier assembly having a unique structure resistant to thermal-mechanical stresses.

In accordance with the invention, we provide a semiconductive power rectifier assembly in which all internal members are solid and of sizes, shapes and materials which are matched or nearly matched to the outer housing with respect to thermal expansion along the axial direction and contraction along the axial and radial directions. The assembly includes solid, substantially inflexible contact members electrically connected to opposite sides of a semiconductive element, a generally tubular housing of ceramic material or the like surrounding the semiconductive element and extending between the contact members, and means hermetically sealing opposite ends of the housing to the contact member. As will be seen, any differential in thermal expansion rates between the various parts of the assembly is facilitated by means of a unique arrangement of integral flanged portions on one or both of the contact members which have a minor degree of flexibility enabling expansion between the various parts. By "substantially inflexible" electrical contact members as used in the following specification and claims, it is meant that in contrast to stranded cables or the like, all members are solid, although they may have integral portions which have the slight degree of flexibility mentioned above.

The above and other objects and features of the invention will become apparent from the following detailed description taken in connection with the accompanying drawings which form a part of this specification, and in which:

FIG. 3 is an enlarged cross-sectional view showing the manner in which radial differential thermal expansion forces are compensated for;

Figure 1:
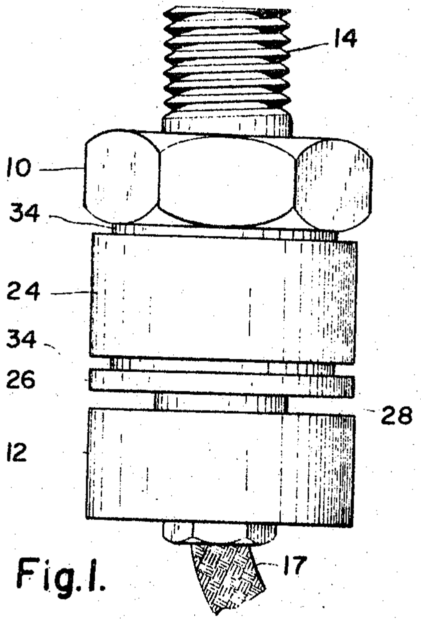
FIGURE 1 is a plan view of a power rectifier assembly constructed in accordance with the principles of the present invention.

Referring now to the drawings, and particularly to FIG. 1, the assembly shown includes two solid and integral power terminals 10 and 12 adapted for connection to a source of electrical power, not shown. In the particular embodiment of the invention shown herein, the upper terminal 10 is in the form of a hex nut and has an integral, upwardly projecting threaded stud 14. The lower terminal 12, on the other hand, is provided with an opening 16 into which is threaded a heavy braided lead 17. The terminals 10, 12 are formed of materials having relatively high thermal and electrical conductivity such as copper, copper-base alloys, silver, silver-base alloys, aluminum and aluminum-base alloys. Copper and brass are particularly satisfactory for this purpose. Between the upper and lower terminals 10 and 12 is a semiconductor rectifying element 18 which may, for example, comprise either silicon or germanium having upper and lower P and N portions. The semiconductor element 18 is mechanically and electrically connected to the terminal members 10 and 12 by metallic discs 20 and 22, respectively, which are soldered or brazed to the parts 10, 12 and 18.

Surrounding the semiconductor element 18 and the discs 20 and 22 is a generally tubular insulating element 24 which is formed from a ceramic material such as electrical grade porcelain, high grade alumina or zircon porcelain. One material which has been found particularly satisfactory for this purpose is an alumina porcelain sold under the trademark Al Si Mag 645 by American Lava Corporation.

These discs 20 and 22 may be, although not necessarily, formed in a manner similar to that described in U.S. Patent No. 3,097,329 issued to A. Siemens on July 9, 1963 and have graded concentrations of metals to accommodate the different coefficients of expansion of the terminals 10 and 12 and the semiconductor element 18. In this respect, each of the discs 20 and 22 may comprise a plurality of sintered horizontal layers. Assuming that the element 18 comprises a silicon rectifier, the layer of disc 20 or 22 closest to element 18 may comprise a metal selected from the group consisting of molybdenum and tungsten or their alloys. The layer closest to the terminal 10 or 12, on the other hand, is preferably formed from the same metal as the members 10 and 12 or it may consist of another metal having substantially the same thermal coefficient of expansion as the metal of members 10 and 12. The intermediate layers moving outwardly from the element 18 contain a continuously increasing proportion of a metal having the same thermal coefficient of expansion as the terminals 10 and 12.

Regardless of the materials used for the various parts of the assembly, it is essential to match the vertical dimensions and materials of the tubular element 24, the discs 20 and 22, and the element 18 such that any dimensional changes due to heating or cooling of the inner members will be equal, or nearly equal, to similar changes in the tubular element 24, thus maintaining the soundness of the structure. Furthermore, regardless of the care taken to match the thermal coefficients of expansion of these parts, a certain amount of unequal changes in the lengths of the internal parts and the surrounding element 24 may occur. This unequal expansion is compensated for in accordance with the invention by providing on the lower terminal 12 a generally annular flange 26 which, in effect, forms a cantilever arrangement having a limited degree of flexibility. That is, the cantilever flange 26 can move vertically (i.e., along the axis of the device between elements 10 and 12) by rotation about a point in the lower terminal 12 directly above the root of a groove 28 which is formed in the member 12 to form the flange 26.

Figure 2:
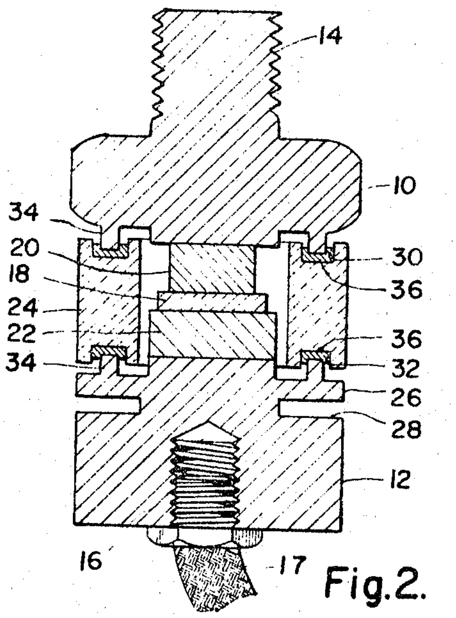
FIG. 2 is a cross-sectional view of the power rectifier assembly of FIG. 1, showing its internal parts.
Figure 3:
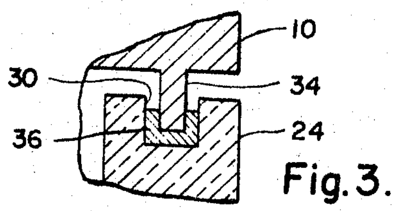

With specific reference now to FIGS. 2 and 3, the tubular insulator 24 is hermetically sealed to the upper and lower terminal members 10 and 12 while permitting radial expansion between the two by an arrangement including annular grooves 30 and 32 formed in the top and bottom edges, respectively, of the element 24. Projecting into the grooves 30 and 32 are annular flanges 34 integrally formed on the upper and lower terminal members 10 and 12, respectively. The surfaces of each groove 30 and 32 are initially fired, as by flame-spraying, with an alloy of molybdenum and manganese and then nickel which are effectively sintered into the body of the ceramic element 24. The hermetic seal is formed by filling the grooves 30 and 32 with solder 36, preferably soft solder, which bonds the alloy coating on the periphery of the groove to the annular flange 34 which extends into the groove. Alternatively, the material 36 may comprise any suitable epoxy resin or other bonding material. Preferably, the copper or the like terminals 10 and 12 are nickel plated, including the flanges 34, so as to effect a good bond between the solder 36 and the surfaces of the flanges 34.

As can best be seen in FIG. 3, the flanges 34, like flange 26, form a cantilever arm arrangement which has limited flexibility in radial directions with respect to the longitudinal axis of terminals 10 and 12. As will be appreciated, this facilitates differential radial expansion forces between the element 24 and terminals 10 and 12.

In the manufacture of the device shown in FIG. 2, the discs 20 and 22 are initially brazed or soldered to the semiconductor element 18 and the terminals 10 and 12. Thereafter, the annular slots 30 and 32 are filled with unmelted solder and the assembly passed through a hydrogen atmosphere furnace, whereupon the solder melts and bonds to the metallic coating on the slots and the nickel plating on the flanges 34 to effect a hermetic seal.

Figure 4:
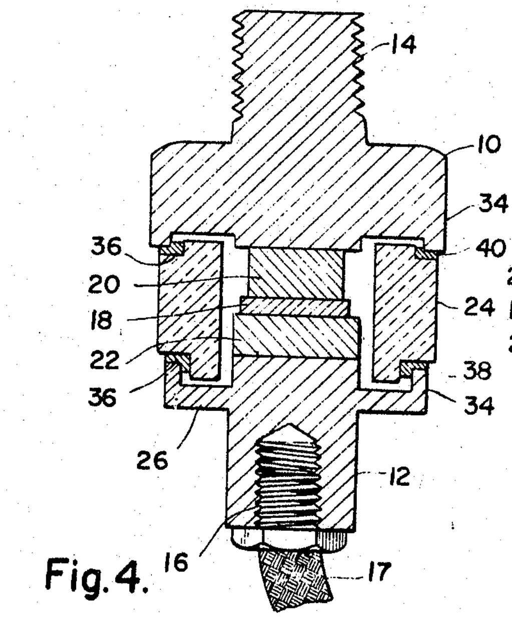
FIG. 4 is a cross-sectional view of another embodiment of the invention.

In FIG. 4, another embodiment of the invention is shown wherein elements corresponding to those shown in FIG. 2 are identified by like reference numerals. In this case, however, the annular slots 30 and 32 in the embodiment of FIG. 2 are replaced by annular shoulders 38 and 40 formed in the edges of the sleeve 24. These shoulders, like slots 30 and 32, are fired with an alloy of molybdenum, manganese and nickel, the terminals 10 and 12 are nickel plated, and liquid solder or an epoxy resin is employed to bond the two together. The member 12, however, has considerably less mass than that shown in FIG. 2 by virtue of the fact that the slot 28 is eliminated with the diameter of the member 12 beneath the flange considerably reduced.

Figure 5:
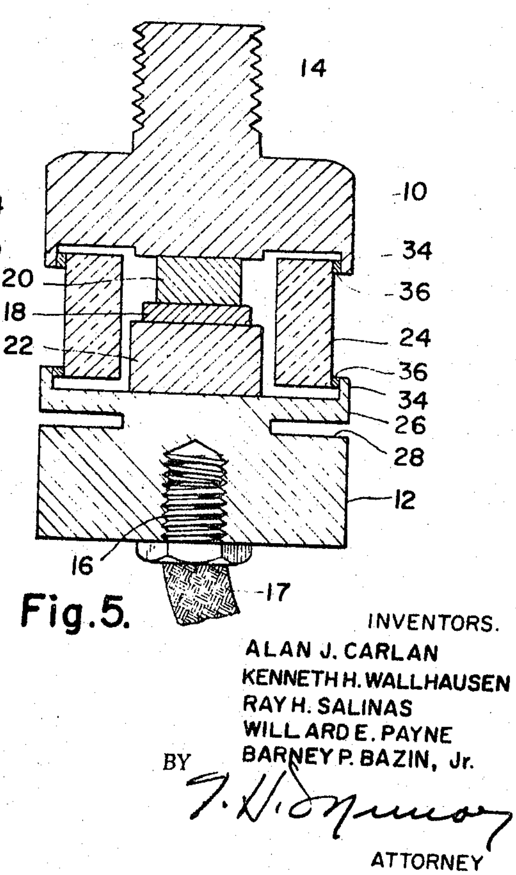
FIG. 5 is a cross-sectional view of still another embodiment of the invention.

In FIG. 5 still another embodiment of the invention is shown wherein elements corresponding to those shown in FIG. 2 are again identified by like reference numerals. In this particular embodiment, neither grooves nor shoulders are provided at opposite ends of the sleeve 24. Rather, the flanges 34 extend over the edges of the sleeve 24 and are bonded thereto by means of liquid solder or an epoxy resin in the same manner as described above.

Although the invention has been shown in connection with certain specific embodiments, it will be readily apparent to those skilled in the art that various changes in form and arrangement of parts may be made to suit requirements without departing from the spirit and scope of the invention.

We claim as our invention:

1. In a semiconductor device of the type in which a semiconductor element is housed within a surrounding envelope, the combination of solid substantially inflexible electrical contact members rigidly secured and electrically connected to opposite sides of said semiconductive element, a generally tubular housing of ceramic material surrounding the semiconductive element and extending between said contact members, means including flanges on the contact members extending along the axis of the semiconductor device for sealing opposite ends of the housing to the contact members, and a generally annular groove in one of said contact members forming a generally annular flange to which the housing is sealed and which has a degree of cantilever arm-type flexibility with respect to said one contact member enabling thermal expansion and contraction of the tubular housing along the axis of the semiconductor device, the flexibility of the annular flange being sufficient to prevent fracture of the semiconductive element under thermal expansion and contraction forces encountered in the operation of the semiconductor device.

2. In a semiconductor device of the type in which a semiconductive element is housed within a surrounding envelope, the combination of solid substantially inflexible electrical contact members rigidly secured and electrically connected to opposite sides of said semiconductive element, one of said members having an integral generally annular flange projecting radially outwardly therefrom, the flange having a degree of cantilever-type flexibility with respect to said one member, a generally tubular housing of ceramic material surrounding the semiconductive element and extending between said generally annular flange on said one contact member and the other member, annular flanges on said other member and said flange respectively, said latter-mentioned flanges extending along the axis of the semiconductor device, and means sealing opposite ends of the housing to the latter-mentioned flanges, the arrangement being such that the first-mentioned flange, together with the latter-mentioned flanges will permit differential expansion of the parts of the semiconductor device without breaking said seal and without fracturing the semiconductor device.

3. The combination of claim 2 wherein the means for sealing the opposite ends of the housing to the annular flanges comprises solder.

4. The combination of claim 2 wherein the means for sealing the opposite ends of the housing to the annular flanges comprises an epoxy resin.

References Cited by the Examiner

UNITED STATES PATENTS

| | | | |
|---|---|---|---|
| 2,443,605 | 6/1948 | De Lange | 174—52 |
| 2,798,577 | 7/1957 | La Forge. | |
| 2,842,699 | 7/1958 | Germeshausen et al. | 174—50.58 |

| | | | |
|---|---|---|---|
| 3,025,435 | 3/1962 | Green | 174—52 X |
| 3,077,639 | 2/1963 | Siner et al. | 174—52 X |
| 3,110,080 | 11/1963 | Boyer et al. | |

FOREIGN PATENTS

| | | |
|---|---|---|
| 1,304,469 | 8/1962 | France. |
| 761,662 | 11/1956 | Great Britain. |
| 914,592 | 1/1963 | Great Britain. |
| 570,383 | 4/1956 | Italy. |

LEWIS H. MYERS, *Primary Examiner.*

JOHN F. BURNS, ROBERT K. SCHAEFER, *Examiners.*

W. B. FREDRICKS, J. F. RUGGIERO, *Assistant Examiners.*